(12) United States Patent
Li (10) Patent No.: US 7,072,819 B2
(45) Date of Patent: Jul. 4, 2006

(54) METHOD FOR LOCATING FUNCTIONAL MISTAKES IN DIGITAL CIRCUIT DESIGNS

(76) Inventor: Zhe Li, 1 Argent Dr., Poughkeepsie, NY (US) 12603

( * ) Notice: Subject to any disclaimer, the term of this patent is extended or adjusted under 35 U.S.C. 154(b) by 657 days.

(21) Appl. No.: 09/759,414

(22) Filed: Jan. 13, 2001

(65) Prior Publication Data

US 2002/0004919 A1 Jan. 10, 2002

Related U.S. Application Data

(60) Provisional application No. 60/176,446, filed on Jan. 14, 2000.

(51) Int. Cl.
*G06F 17/50* (2006.01)

(52) U.S. Cl. .............................. 703/14; 714/4; 715/514

(58) Field of Classification Search .................. 703/11, 703/14; 716/4, 489; 715/514; 714/741, 714/4

See application file for complete search history.

(56) References Cited

U.S. PATENT DOCUMENTS

| | | | | |
|---|---|---|---|---|
| 5,059,897 A | * | 10/1991 | Aton et al. | 324/538 |
| 5,469,367 A | * | 11/1995 | Puri et al. | 716/18 |
| 5,752,000 A | * | 5/1998 | McGeer et al. | 703/14 |
| 5,910,897 A | * | 6/1999 | Dangelo et al. | 716/19 |
| 5,923,569 A | * | 7/1999 | Kumashiro et al. | 716/7 |
| 5,983,008 A | * | 11/1999 | Kumashiro et al. | 716/6 |
| 6,057,171 A | * | 5/2000 | Chou et al. | 438/15 |
| 6,532,440 B1 | * | 3/2003 | Boppana et al. | 703/14 |

OTHER PUBLICATIONS

Huang-S. Y. et al. "AutoFix: A Hybrid Tool for Automatic Logic Rectification" IEEE Sep. 1999, pp. 1376-1384.*
Huang-S. Y. "ErrorTracer: Design Error Diagnosis based on Fault Simulation Techniques" IEEE Sep. 1999 pp. 1341-1352.*
Lin-C.C. et al. "Logic Synthesis for Engineering Change" IEEE Mar. 1999, pp. 282-292.*
Huang-S.Y. et al. "Fault Simulation based Design Error Diagnosis for Sequential Circuits" ACM Jun. 1998, pp. 632-637.*
Veneris et al. "A Fast Algorithm for Locating and Correcting Simple Design Errors in VLSI Digital Circuits" IEEE Apr. 1997, pp. 45-50.*
Huang et al. Incremental Logic Rectification IEEE Apr. 1997, pp. 143-149*

(Continued)

*Primary Examiner*—Paul L. Rodriguez
*Assistant Examiner*—Tom Stevens (57) ABSTRACT

This debugging method exhaustively analyzes the impact of any set of given interrelated signal values in a digital circuit on the circuit's ability to satisfy a set of functional expectations. It accomplishes this automatically by inspecting paths in a binary decision diagram representation of the logical relationship between the signal values in the circuit. As the result, it is able to list all combinations of desirable values on these given signals, and therefore it can conclusively identify which signals are irrelevant and which signals are always involved while other signals are involved under certain known conditions.

20 Claims, 5 Drawing Sheets

OTHER PUBLICATIONS

Huang et al. "Error Tracer: A Fault Simulation-based Approach to Design Error Diagnosis" Nov. 1997 pp. 974-981.*
Lin-C. C. et al. Logic Synthesis for Engineering Change. ACM Jun. 1995. p. 647-652.*
Reddy et al. "On Correction of Multiple Design Errors" IEEE Feb. 1995. pp. 255-264.*
Reddy et al. "On Error Correction in Macro-based Circuits" ACM Nov. 1994 p. 568-574.*
Brand et al., "Incremental Synthesis" ACM Nov. 1994, pp. 14-18.*
Kuehlmann et al., "Error Diagnosis for Transistor-Level Verification" ACM Jun. 1994, pp. 218-224.*
Pomeranz et al., "A Method for Diagnosing Implementations Errors in Synchronous Sequential Circuits and its Implications on Synthesis" Sep. 1993, pp. 252-258.*
Fujita et al., "Methods of Automatic Design Error Correction in Sequential Circuits" IEEE Sep. 1993. pp. 76-80.*
Chung et al. "Diagnosis and Correction of Logic Design Errors in Digital Circuits" IEEE Jun. 1993, pp. 503-508.*
Kuo et al., "Locating Logic Design Errors via Test Generation and Don't-Care Propagation" IEEE Sep. 1992, pp. 466-471.*
Chung et al., "ACCORD: Automatic Catching and Correction of Logic Design Errors in Combination Circuits" IEEE Oct. 1992, pp. 747-751.*
Wantanabe et al., "Incremental Synthesis for Engineering Changes" IEEE Nov. 1991. p. 40-43.*
Tomita et al., "An Algorithm for Locating Logic Design Errors" IEEE Nov. 1990. pp. 468-467.*
Liaw et al., "Efficient Automatic the Diagnosis and the Rectification of Design Errors with PRIAM" IEEE Nov. 1989. pp. 30-33.*
Madre et al., "Automating the Diagnosis and the Rectification of Design Errors with PRIAM" IEEE Nov. 1989, p. 30-33.*
Tamura-K.A., "Locating Functional Errors in Logic Circuits" ACM Jun. 1989, pp. 185-191.*
Wan et al., "VHdbx: An X Window System based High-Level Debugger for the VHDL Simulation Environment" 1995 p. 358-360 IEEE Electron Devices Soc.*
Li-Z, "Binary Decision Diagram for Computer-Aided Logic Design and Verification" 1991 Dissertation, Syracuse University 152 pages.*
Wan et al., "VHdbx: An X Window System Based Hight-Level Debugger for the VHDL Simulation Environment" 1995. IEEE p. 358-360.*
S.-Y. Huang et al, "AutoFix: a hybrid tool for automatic logic rectification" IEEE Transactions on Computer-Aided Design of Integrated Circuits and Systems, vol. 18, No. 9, Sep. 1999, pp. 1376-1384, IEEE, U.S.A.
S.-Y. Huang and K.-T. Cheng, "ErrorTracer: design error diagnosis based on fault simulation techniques" IEEE Transactions on Computer-Aided Design of Integrated Circuits and Systems, vol. 18, No. 9, Sep. 1999, pp. 1341-1352.
C.-C. Lin et al, "Logic synthesis for engineering change" IEEE Transactions on Computer-Aided Design of Integrated Circuits and Systems, vol. 18, No. 3, Mar. 1999, pp. 282-292, IEEE, U.S.A.
S.-Y. Huang et al, "Fault simulation based design error diagnosis for sequential circuits" Proceedings Design Automation Conference, Jun. 1998, pp. 632-637, ACM, U.S.A.
A. G. Veneris and I.N. HAJJ, "A fast algorithm for locating and correcting simple design errors in VLSI digital circuits" Proceedings Great Lake Symposium on VLSI Design, Mar. 1997, pp. 45-50, IEEE, U.S.A.
S.-Y. Huang et al, "Incremental logic rectification" Proceedings VLSI Test Symposium, Apr. 1997, pp. 143-149, IEEE, U.S.A.
S.-Y. Huang et al, "ErrorTracer: a fault simulation-based approach to design error diagnosis" Proceedings International Test Conference, Nov. 1997, pp. 974-981, IEEE, U.S.A.
C.-C. Lin et al. "Logic synthesis for enginerring change" Proceedings Design Automation Conference, Jun. 1995, pp. 647-652, ACM, U.S.A.
I. Pomeranz and S. Reddy, "On correction of multiple design errors" IEEE Transaction on Computer-Aided Design of Integrated Circuits and Systems, vol. 14, No. 2, Feb. 1995, pp. 255-264, IEEE U.S.A.
I. Pomeranz and S. M. Reddy, "On error in macro-based circuits" Proceedings International Conference on Computer-Aided Design, Nov. 1994, pp. 568-574, ACM, U.S.A.
D. Brand et al, "Incremental synthesis" Proceedings International Conference on Computer-Aided Design, Nov. 1994, pp. 14-18, ACM, U.S.A.
A. Kuehlmann et al, "Error diagnosis for transistor-level verification" Proceedings Design Automation Conference, Jun. 1994, pp. 218-224, ACM, U.S.A.
I. Pomeranz and S.M. Reddy, "A method for diagnosing implementations errors in synchronous sequential circuits and its implications on synthesis" Proceedings European Conference on Design Automation, Sep. 1993, pp. 252-258, IEEE.
M. Fujita, "Methods for automatic design error correction in sequential circuits" Proceedings European Conference on Design Automation, Sep. 1993, pp. 76-80, IEEE.
P.-Y. Chung et al, "Diagnosis and correction of logic design errors in digital circcuits" Proceedings Design Automation Conference, Jun. 1993, pp. 503-508, IEEE, U.S.A.
S.-Y-. Kuo, "Locating logic design errors via test generation and don't care propagation" Proceedings European Design Automation Conference, Sep. 1992, pp. 466-471, IEEE.
P.-Y. Chung and I.N. Hajj, "Accord: automatic catching and correction of logic design errors in combinational circuits" Proceedings International Test Conference, Oct. 1992, pp. 742-751, IEEE. U.S.A.
Y. Watanabe and R. Brayton, "Incremental synthesis for engineering changes" Proceedings International Conference on Computer-Aided Design, Nov. 1991, pp. 40-43, IEEE, U.S.A.
M. Tomita et al, "An algorithm for locating logic design errors" Proceedings International Conference on Computer-Aided Design, Nov. 1990, pp. 468-471, IEEE, U.S.A.
H.-T. Liaw et al, "Efficient automatic diagnosis of digital circuits" Proceedings International Conference on Computer-Aided Design, Nov. 1990, pp. 464-467, IEEE, U.S.A.
J.C. Madre et al, "Automating the diagnosis and the rectification of design errors with PRIAM" Proceedings International Conference on Computer-Aided Design, Nov. 1989, pp. 30-33, IEEE, U.S.A.
K.A. Tamura, "Locating functional errors in logic circuits" Proceedings Design Automation Conference, Jun. 1989, pp. 185-191, ACM, U.S.A.

* cited by examiner

METHOD FOR LOCATING FUNCTIONAL MISTAKES IN DIGITAL CIRCUIT DESIGNS

CROSS-REFERENCE TO ELATED APPLICATIONS

This application is entitled to the benefit of provisional patent application No. 60/176446, titled Method for Locating Functional Mistakes in Digital Circuit Design and filed on Jan. 14$^{th}$, 2002, the contents of which are herein incorporated by reference.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

This invention relates to electronic design automation of electronic circuits, specifically to locating where the functional mistakes are in digital circuit designs, using a digital computer, after knowing the existence of the mistakes in the designs.

A digital circuit comprises gates, registers and wires connecting the gates and registers, and a description of a digital circuit can be at behavior level, register transfer level, gate level, transistor level, etc. In a digital circuit, a signal value of a wire at any time is either 0 or 1. When a digital circuit responds to a specific stimulus, the signal value of each wire in the circuit makes a waveform because the value can be different at different times. A subset of the waveforms of all wires in the digital circuit is the circuit behavior. For the purpose of avoiding erroneous chips, it is important to find design mistakes before fabricating the chip. A design mistake is a functional mistake if it causes incorrect circuit behavior regardless the circuit speed.

After discovering the existence of functional mistakes using a verification method, it is necessary to locate the functional mistakes before correcting them. This task of locating mistakes is generally known as debugging. It is more art than science to perform the tasks of locating and correcting the mistakes. A circuit can have many different correct implementations, and therefore there are many ways to fix the same functional mistake. Furthermore, different functional mistakes may cause the same error in the circuit behavior though they may also cause other different errors in the circuit behavior. As the result, correcting functional mistakes involves trial-and-error.

A part of locating functional mistakes is to identify where in the design the functional mistake likely is. If this part is done well, the rest of the work becomes much easier. However, this part normally relies on human decisions and tools are only used to assist. Some tools show the circuit behavior or the design in more understandable ways. Some other tools, normally integrated parts of simulators, allow parts of circuit behavior to follow user commands rather than to be driven by the circuit structure. There are needs for tools providing more direct assistance. Tools moving into the direction of providing further assistance can show direct (the nearest time or the nearest structural connection or the nearest both) cause(s) of a signal value, but none of them can exhaustively show the different combinations of correlated causes of one or more values in waveforms without significant restrictions. This difficulty is from the fact that the influence cones of signals can be very large while different signals can interfere with each other or they can depend on the same source.

Construction of binary decision diagrams for any Boolean functions is well known in the art, but it is not previous applied in interactive debugging of digital circuits.

BRIEF SUMMARY OF THE INVENTION

The present invention provides a method for identifying which parts of a digital circuit design the functional mistakes are likely in. It takes user's inputs of the incorrect circuit behavior and of the expected circuit behavior for a specific stimulus. It also needs users specification of a set of points in waveforms for corrections to happen. This method does the job by finding all possible ways, in terms of the given set of points in waveforms, to fix the design after building a binary decision diagram for a specially constructed cone of logic. The resultant value corrections in waveforms provide helpful hints for user to decide structural changes in the circuit design.

This method can be used iteratively with different given sets of points in waveforms. This iterative fashion makes it possible to obtain likelihood ratings in gradually focused parts of the circuit design.

By connecting several specially constructed cones to the inputs of an OR gate, this method can also be used for several simulation runs with different stimuli so that it can suggest structural changes for fixing all known errors.

DETAILED DESCRIPTION OF THE INVENTION

A debugging method for interactively locating functional mistakes in a digital circuit design is disclosed.

Figure 1:
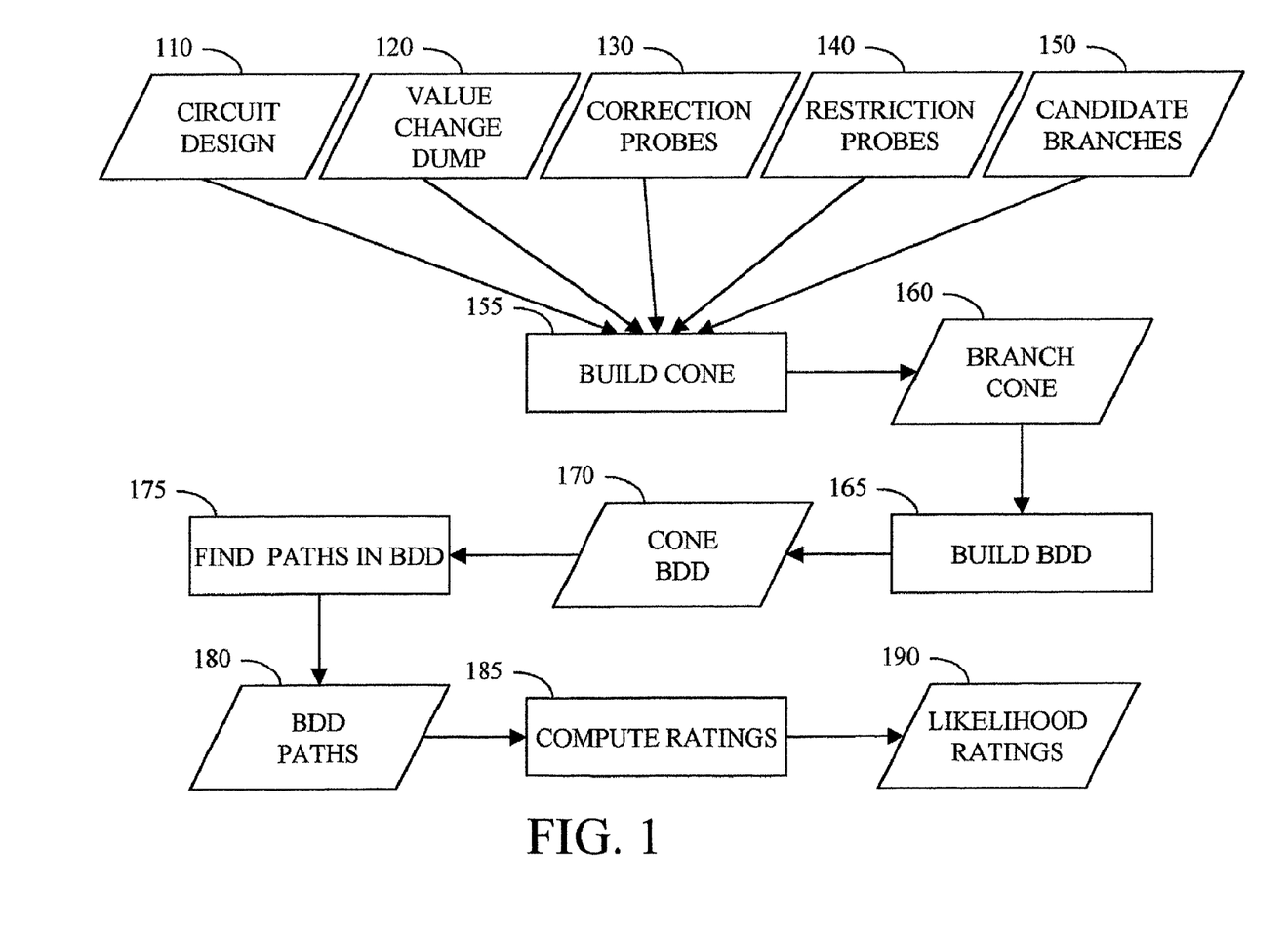
FIG. 1 illustrates, in flow diagram form, a method for interactively locating functional mistakes in a digital circuit design.

This method, illustrated in FIG. 1, is applicable after the circuit behavior is shown to be incorrect with simulation. The simulation is performed on a circuit design 110, which includes descriptions of components in the circuit and signals connecting these components. The simulation run produces a value change dump 120, which shows the values of all relevant signals at all relevant simulated times. The incorrect circuit behavior is described as one or more correction probes 130. Each of correction probes 130 includes a signal name, a simulated time and an expected value. The signal name identifies where in the circuit the incorrect behavior is detected. The simulated time shows when in the simulation the incorrect behavior happens. The expected value is the supposedly correct behavior. The behavior calculated from the original simulation for the signal and the time identified respectively by the signal name and the simulated time of any of correction probes 130 (called the behavior at this one of correction probes 130) must not be the same as the expected value of this one of correction probes 130.

When using this method, a user provides zero or more restriction probes 140 and one or more candidate branches 150 in addition to circuit design 110, value change dump 120 and correction probes 130.

Each of restriction probes 140 includes a signal name, a simulated time and an expected value. The behavior calculated from any simulation for the signal and the time identified respectively by the signal name and the simulated time of any of restriction probes 140 (called the behavior at this one of restriction probes 140) must be the same as the expected value of this one of restriction probes 140.

Each of candidate branches 150 includes a signal name and a simulated time. The behavior for the signal and the time identified respectively by the signal name and the simulated time of any of candidate branches 150 (called the behavior at this one of candidate branches 150) can be forced to be different than that from the original simulation. Candidate branches 150 identify where the suspected locations of the functional mistakes are, and this method provides further assurance.

The behavior at any of correction probes 130 may change from the original simulation if the behaviors at some of candidate branches 150 are forced to change. Any other behavior does not change if this other behavior does not depend on the behavior at any of candidate branches 150. However, none of these changes should cause any change in the behavior at any of restriction probes 140.

Normally the expected values for some signals at some times are given before running simulation because they provide the reference for deciding whether there are any functional mistakes. In such cases, correction probes 130 and restriction probes 140 can be determined from these expected values. It goes into correction probes 130 if the expected value does not agree with the behavior from the original simulation for the signal at the time. It goes into restriction probes 140 if the expected value agrees with the behavior from the original simulation for the signal at the time. It goes to neither set if the expected value is not given for the signal at the time. The original simulation also provides value change dump 120, which includes the behaviors at all correction probes 130, at all restriction probes 140 and at all candidate branches 150. Therefore, the only required new information from the user is candidate branches 150.

This method investigates what directly forced changes in the behaviors at candidate branches 150 can cause the behavior at each of correction probes 130 to become the same as the expected value of this one of correction probes 130 without causing any change in the behavior at any of restriction probes 140. If these directly forced changes include the change in the behavior at any of candidate branches 150, a functional mistake in circuit design 110 is likely either at a signal which directly or indirectly depends on the signal identified in this one of candidate branches 150 or at a signal on which the signal identified in this one of candidate branches 150 depends directly or indirectly. If none of these directly forced changes includes any change in the behavior at a specific one of candidate branches 150, no functional mistake in the circuit design is likely at any signal which depends on the signal identified in this specific one of candidate branches 150 or at a signal on which the signal identified in this specific one of candidate branches 150 depends. It is possible that such directly forced changes do not exist, which implies the need of modifying at least one of the three given sets (correction probes 130, restriction probes 140 and candidate branches 150) before locating the functional mistakes.

Figure 2:
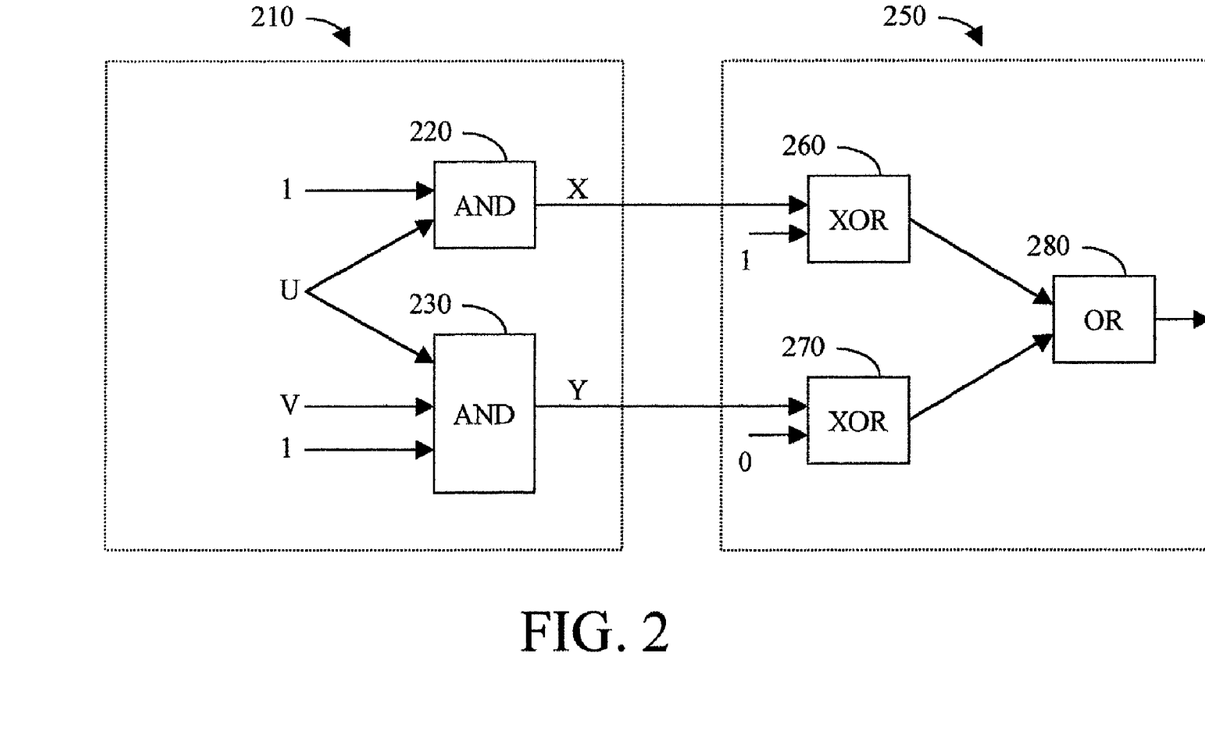
FIG. 2 illustrates, in block diagram form, an example branch cone for building a binary decision diagram.

An example is illustrated in FIG. 2. On the left hand side, it shows a part 210 of circuit design 110. Part 210 includes two components, a 2-input AND gate 220 and a 3-input AND gate 230. Two of the inputs in part 210 have value 1, which is known from value change dump 120. Two other inputs in part 210 have signal names U and V, and these signal names are in the only two candidate branches 150. An output signal is named X, and another output signal is named Y. There is only one correction probe 130, whose signal name is X, and there is only one restriction probe 140, whose signal name is Y. The expected value of correction probe 130 is 1, shown as an input to an XOR gate 260. The expected value of the restriction probe 140 is 0, shown as an input to an XOR gate 270. None of the relevant simulated times is shown, and all the relevant simulated times are supposed to be the same (say 7 units) in this example.

Given all the required data shown in the top row of FIG. 1, a step 155 is performed to build a branch cone 160. Branch cone 160 is a structural representation of how to achieve the target condition that all expectations are satisfied by circuit design 110. Branch cone 160 consists of 2 parts: a simplified version of circuit design 110 and a comparator.

The first part of branch cone 160 includes the parts (or their copies) of circuit design 110 that are on the paths of signal value propagation from any of candidate branches 150 to any of restriction probes 140 or to any of correction probes 130. Each of candidate branches 150 is an input to branch cone 160, and all drivers to these inputs are completely ignored. If the connections from candidate branches 150 to the union of restriction probes 140 and correction probes 130 go though the same part of circuit design 110 multiple passes, several copies of this part are made so that these connections does not go through each copy repeatedly. This unrolling technique is known to those skilled in the art. The rest parts of circuit design 110 are replaced with the corresponding values in value change dump 120, or are ignored if they are not directly connected to branch cone 160. The inputs of branch cone 160 are candidate branches 150.

The second part of branch cone 160 includes an OR gate and one or more 2-input XOR gates which all feed the OR gate. The only output of branch cone 160, which is also the output of the OR gate fed by the XOR gates, has behavior 0 if the expected values of all correction probes 130 and of all restriction probes 140 are respectively the same as the behaviors at correction probes 130 and at restriction probes 140. There is one XOR gate for each of correction probes 130 or of restriction probes 140. Each signal whose name is in any of correction probes 130 or of restriction probes 140 is connected to an input of at least one of these XOR gates. If the simulated time of this one of correction probes 130 or of restriction probes 140 is not earlier than the simulated time of any other of correction probes 130 or of restriction probes 140, this signal is connected directly to an input of the gate. Otherwise, the connection is through one or more delay elements, and the total delay of these delay elements equals to the difference between the simulated time of this one of correction probes 130 or restriction probes 140 and the latest simulated time of all correction probes 130 and all restriction probes 140. A D flip-flop can be used as a delay element for delaying one clock cycle. The expected value of this one of correction probes 130 or of restriction probe 140, as a constant, is connected directly to the other input of this XOR gate. If a signal name appears in a plurality of correction probes 130 and restriction probes 140, a different XOR gate is used for each of these correction probes 130 or of restriction probes 140 because of the different simulated times or the different expected values.

FIG. 2 includes a comparator 250 on the right hand side. Part 250 and part 210 together make branch cone 160 for this example. The output of branch cone 160 is the output of an OR gate 280. Part 210 only includes components (or their copies) from circuit design 110, and part 250 only includes the added XOR gates and the added OR gate as the comparator. Due to the identical simulated time for all candidate branches 150, part 250 does not include any delay elements.

A step 165 is performed after step 155 to build a cone binary decision diagram 170 as illustrated in FIG. 1. Cone binary decision diagram 170 is a mathematical representation of how to achieve the target condition that all expectations are satisfied by circuit design 110. Cone binary decision diagram 170 is simply a binary decision diagram for representing the function of branch cone 160. Building binary decision diagrams for combinational logic functions is known to those skilled in the art, and is used in several patents. In a preferred embodiment, cone binary decision diagram 170 is always reduced (none of its equivalent binary decision diagrams has less edges) and ordered (its input variables follow a predetermined order).

Each node of cone binary decision diagram 170 is marked with an input variable and has 2 outgoing edges unless it is a leaf node. The left outgoing edge stands for that the input variable gets value 1, and the right edge stands for that the input variable gets value 0. Leaf nodes of cone binary decision diagram 170 represent constants 0 and 1.

The impact of the delay elements in branch cone 160 is only to allow input variables of cone binary decision diagram 170 to represent signal behaviors at different simulated times. Cone binary decision diagram 170 represents the output value of branch cone 160 at the latest simulated time of all correction probes 130 and all restriction probes 140. Each input variable of cone binary decision diagram 170 represents one of candidate branches 150 Input variables of cone binary decision diagram 170 are all independent variables.

In a preferred embodiment, step 165 is performed as building binary decision diagrams for all connections between components in branch cone 160, from the inputs to the output. After building a binary decision diagram for the input connection to a delay element, the binary decision diagram for the output connection of the delay element is the same as that for the input connection while the difference in simulated times is only shown in the identifications of the input variables.

Figure 3:
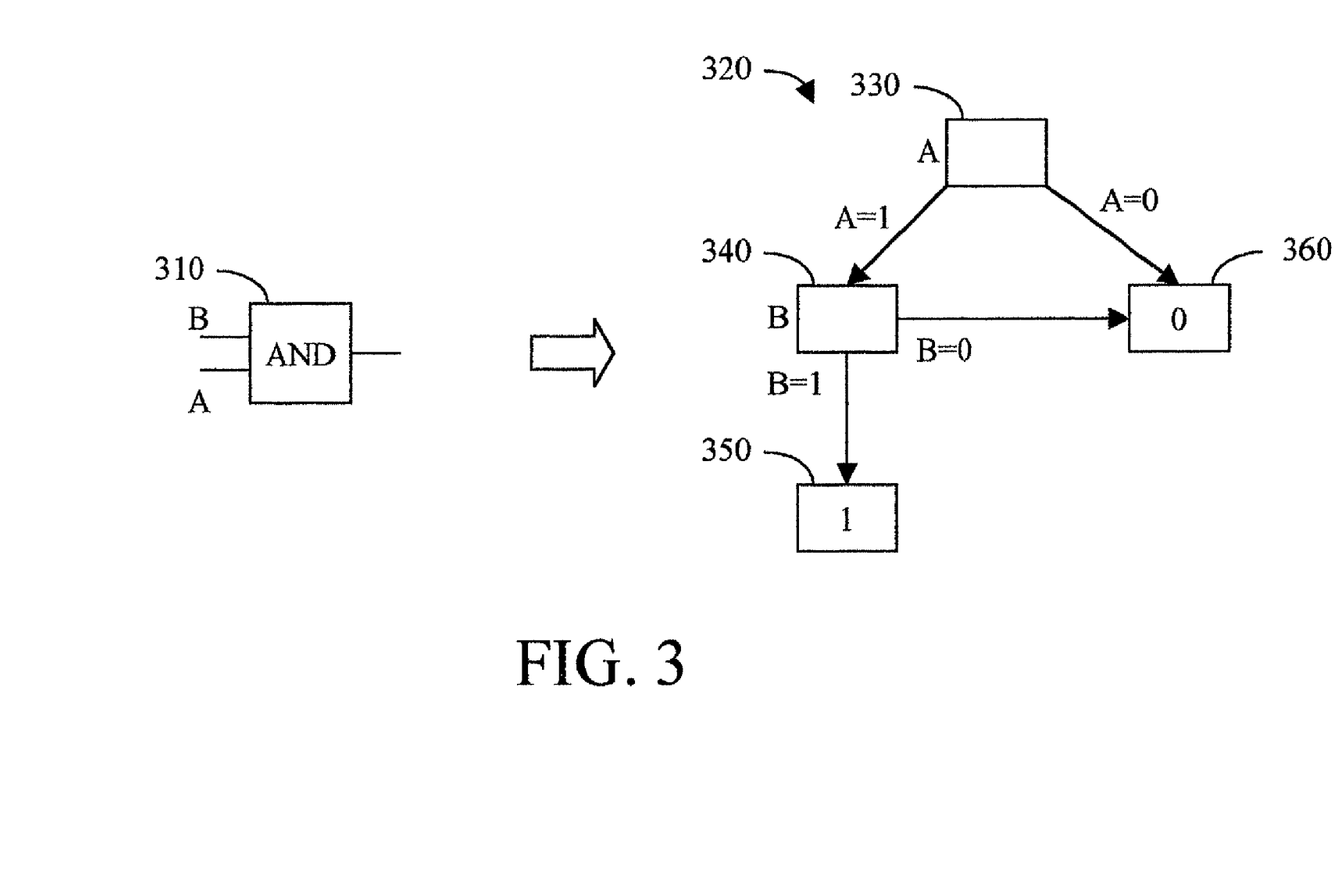
FIG. 3 illustrates an example binary decision diagram for a simple Boolean function.

FIG. 3 illustrates a binary decision diagram 320 of a simple AND gate 310 of two input variables. A node 350 is shown as a leaf node representing Boolean constant 1, and a node 360 is shown as another leaf node representing Boolean constant 0. A node 330 is shown as the root node. A node 340 is neither a leaf node nor a root node.

As illustrated in FIG. 1, a step 175 is performed on cone binary decision diagram 170 to find paths 180. Paths 180 include all and only ways moving in cone binary decision diagram 170 from the root node to the leaf node representing Boolean constant 0. Paths 180 represent all cases of getting 0 at the output of branch cone 160 (i.e. getting the behaviors at all correction probes 130 and at restriction probes 140 to be respectively the same as their expected values). Therefore, it is only needed to consider paths 180 for fixing circuit design 110.

Because each input variable of cone binary decision diagram 170 represents one of candidate branches 150, each of paths 180 corresponds to one or more combinations of possible behaviors at candidate branches 150. If one of paths 180 includes the left outgoing edge of a node marked with an input variable, the behavior at the corresponding one of candidate branches 150 is 1 in all the combinations corresponding to this one of paths 180. If one of paths 180 includes the right outgoing edge of a node marked with an input variable, the behavior at the corresponding one of candidate branches 150 is 0 in all the combinations corresponding to this one of paths 180. If one of paths 180 does not include any outgoing edge of any nodes marked with an input variable, the behavior at the corresponding one of candidate branches 150 is not important in the combinations corresponding to this one of paths 180.

Also because each of candidate branch 150 has a behavior in value change dump 120, paths 180 can be used to determine the need of changing the behavior at any of candidate branches 150 as the following.

A step 185 is performed to compute likelihood ratings 190 based on paths 180. One and only one of likelihood ratings 190 is computed for each input variable of cone binary decision diagram 170 (i.e. for each of candidate branches 150). Given an input variable of cone binary decision diagram 170, each of paths 180 is examined to determine whether it includes a left (or right) outgoing edge of a node marked with this input variable if the behavior at the corresponding one of candidate branches 150 is 0 (or 1) in value change dump 120. One of paths 180 is called a correcting path if it includes such an edge. One of paths 180 is called a non-correcting path if it does not include such an edge. A weight is computed for each of paths 180. The likelihood rating is $M/(M+N)$ for this input variable (or for the corresponding one of candidate branches 150), where M is the sum of the weights of all correcting paths and N is the sum of the weights of all non-correcting paths. If one of candidate branches 150 is not represented by any input variable of cone binary decision diagram 170, the likelihood rating for this one of candidate branches 150 is 0.

The weight of each of paths 180 is 1 in a preferred embodiment. In another preferred embodiment, the weight of each of paths 180 is the result of dividing an initial weight by 2 repeatedly, and the number of times of repeating the division is the number of edges in this one of paths 180. The initial weight is the same for each of paths 180, and it can be 1 or any other number. As the result of this repeated division, each additional edge in one of paths 180 reduces the weight of this one of paths 180 by a half. The different ways of selecting weights (or of calculating the likelihood ratings, which can also be called ratings) influence but do not determine how to select the final structural fix (i.e. the correct way to fix the functional mistake) as described in the following paragraphs.

If the likelihood rating is 0 for one of candidate branches 150, the behavior at this one of candidate branches 150 is never required to be changed from that in value change dump 120 for fixing circuit design 110 (i.e., for the behaviors at all correction probes 130 and at all restriction probes 140 to be the same as their expected values). If the likelihood rating is 1 for one of candidate branches 150, the behavior at this one of candidate branches 150 must be changed for fixing circuit design 110. If the likelihood rating is neither 0 nor 1 for one of candidate branches 150, the behavior at this one of candidate branches 150 is required to change only if the behaviors at some others of candidate branches 150 are also changed.

One way to change the behavior at one of candidate branches 150 is by changing how the signal identified in this one of candidate branches 150 is generated in circuit design 110. Another way to do the same is by changing how the signal identified in this one of candidate branches 150 influences other signals in circuit design 110. Any one of such changes may also change the behaviors at other signals in circuit design 110. Therefore, many other factors need to be considered when deciding the final structural fix. The likelihood ratings may cover some of these factors, but probably not all of them.

Because any function can be implemented correctly with many different circuits, there can be many correct ways to fix any functional mistake. Therefore, many choices of making the correct change in circuit design 110 exist for an engineer to choose.

Given candidate branches 150, each of paths 180 corresponds to at least one of these correct ways to fix it. Each of these correct ways corresponds to one of paths 180 resulting from at least one way of specifying candidate branches 150. So there must exist one or more ways of specifying candidate branches 150 such that paths 180 are not empty. If one of paths 180 includes the left outgoing edge of a node marked with an input variable, the corresponding fix should include the equivalent of making 1 the behavior at the corresponding one of candidate branches 150. If one of paths 180 includes the right outgoing edge of a node marked with an input variable, the corresponding fix should include the equivalent of making 0 the behavior at the corresponding one of candidate branches 150. If an input variable is not involved in one of paths 180, the behavior at the corresponding one of candidate branches 150 need to be determined in other ways for the corresponding fix. Therefore, by trying different candidate branches 150, paths 180 can be found not empty so that likelihood ratings 190 are not all 0's, and some real fixes can be found this way.

This method can also be applied to multiple simulations runs (with different stimuli) of circuit design 110 while each simulation run generates a different copy of value change dump 120. All simulation runs share candidate branches 150, but each of them has its own ones of restriction probes 140 and its own ones of correction probes 130. Each of their restriction probes 140 or their correction probes 130 is treated the same when building branch cone 160 with consideration of that a signal value is from a copy of value change dump 120 for a specific simulation run if one of restriction probes 140 (or correction probes 130) for this simulation run depends on this signal. Then the rest stays the same. Each fix in the end result should cause all these simulation runs being corrected.

The comparator logic in branch cone 160 and binary decision diagram operations obviously can be done in different but equivalent ways. For example, the comparator can be removed completely from branch cone 160 in another embodiment, and the later steps are then related to the binary decision diagrams for the signals at the simulated times both identified in correction probes 130 and in restriction probes 140.

Figure 4:
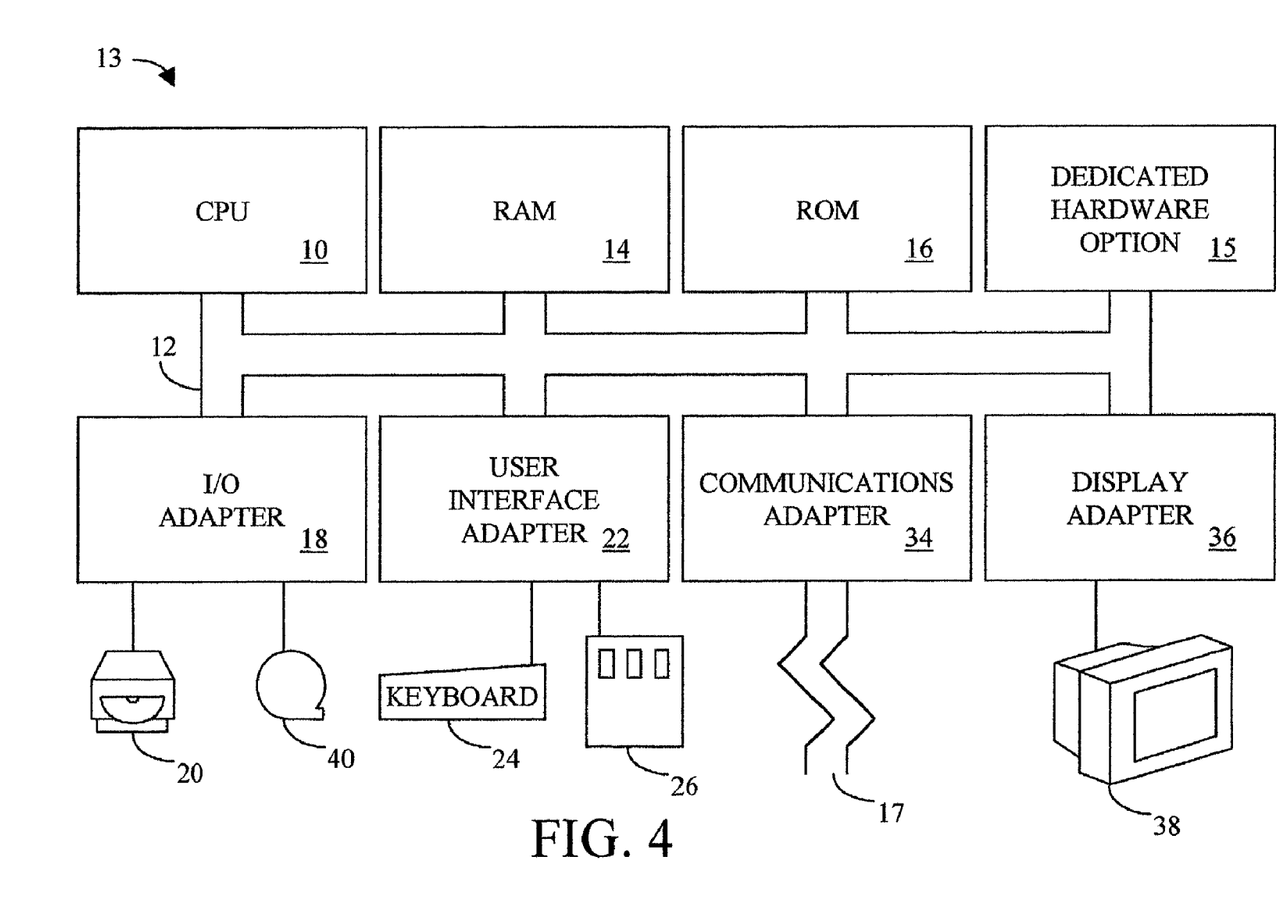
FIG. 4 illustrates a block diagram for computer system in accordance with the present invention.

The invention discussed above may be implemented within dedicated hardware 15 as illustrated in FIG. 4 or within processes implemented within a data processing system 13. A typical hardware configuration of a workstation, that may be implemented to accomplish the method disclosed herein, is illustrated and includes a central processing unit (CPU) 10, such as a conventional microprocessor, and a number of other units interconnected via a system bus 12. The workstation shown in FIG. 4 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to system bus 12. Other user interface devices such as a touch screen device (not shown) may also be coupled to system bus 12 through user interface adapter 22.

A communication adapter 34 is also shown for connecting the workstation to a data processing network 17. Further, a display adapter 36 connects system bus 12 to a display device 38. The method of the present invention may be implemented and stored in one or more of disk units 20, tape drive 40, ROM 16 and/or RAM 14, or even made available to system 13 via network 17 through communication adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 5:
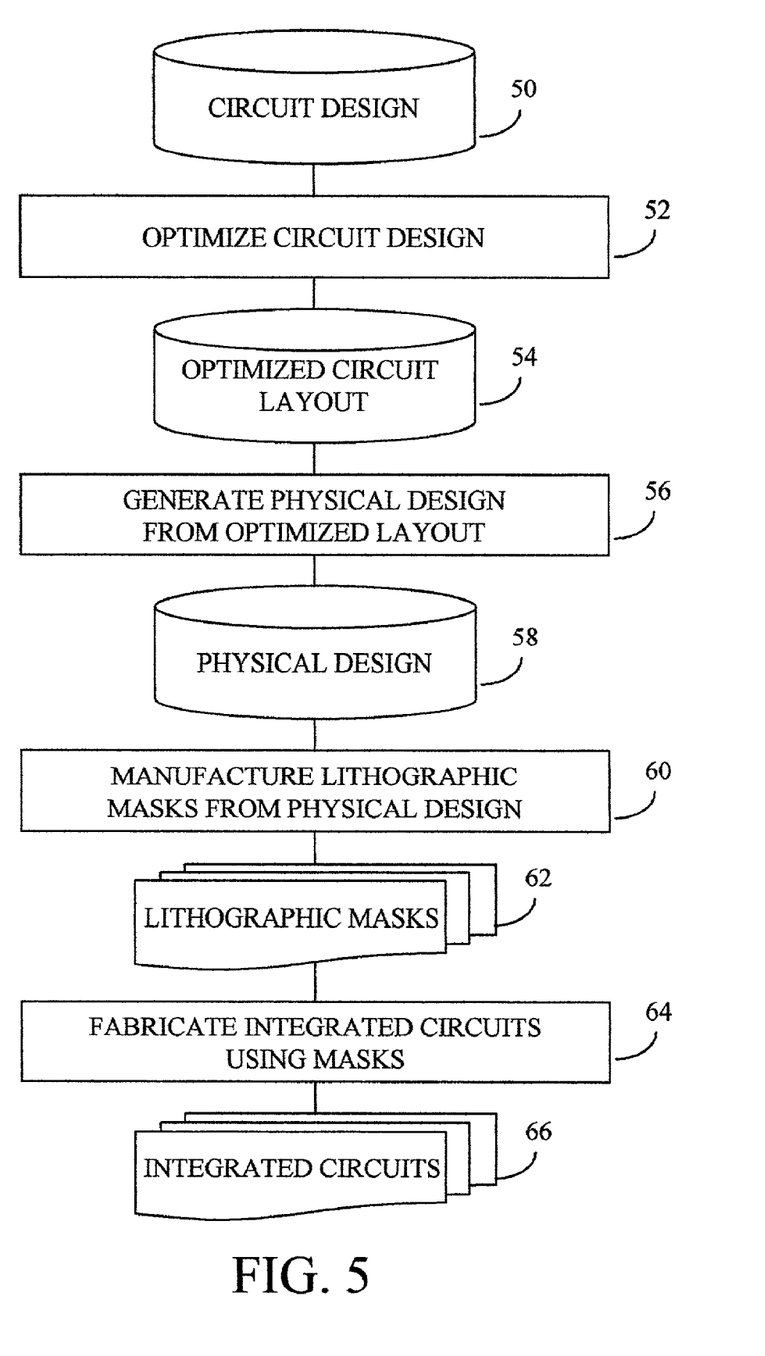
FIG. 5 illustrates a flow diagram for processing circuit designs in accordance with the present invention.

FIG. 5 is a block diagram that illustrates integrated circuit fabrication utilizing the corrected circuit design resulting from using this method of locating functional mistakes. An optimization tool 52 utilizes a circuit design 50 to generate an optimized circuit layout 54. A physical design file 58 is generated 56 from optimized circuit layout 54. Circuit design 50, optimized circuit layout 54, and physical design 58 are typically stored as data files on computer readable media such as disk units 20. Physical design file 58 includes integrated circuit dimensions, element dimensions, and element locations within the integrated circuit. Physical design file 58 locates elements and connections within a two-dimensional substrate area of an integrated circuit die. Preferably, physical design file 58 includes physical structure for performing the functions of an integrated circuit design from which physical design file 58 was derived. Physical design file 58 is converted 60 into a set of lithographic masks 62 corresponding to layers in the physical design file 58. Lithographic masks 62 are used to fabricate 64 integrated circuits 66.

The method taught herein are used to generate CAD (computer aided design) data files which contain information regarding an integrated circuit and placement of gates, transistors, and the like in the integrated circuit. Specifically, the present invention can be used when generating these files. These files are used to form lithographic masks that are then used to form a plurality of integrated circuits on a plurality of wafers using an integrated circuit fabrication facility. The uses of these files and masks are known to those skilled in the art.

While the above invention has been described with reference to certain preferred embodiments, the scope of the present invention is not limited to these embodiments. One skilled in the art may find variations of these preferred embodiments that, nevertheless, fall within the spirit of the present invention, whose scope is defined by the claims set forth below.

I claim:

1. A computer-implemented method for debugging a circuit design given a first set of at least one candidate branch, a second set of at least one correction probe, and a third set of at least zero restriction probe, comprising the steps of:

obtaining said circuit design, said first set of at least one candidate branch, said second set of at least one correction probe, and said third set of at least zero restriction probe, whereby the existence of some functional mistake in the circuit design is clearly shown with definite boundaries;

building a representation of the relationships among objects including said circuit design, said first set of at least one candidate branch, said second set of at least one correction probe, and said third set of at least zero restriction probe; and identifying combinations of behaviors at members of said first set of at least one candidate branch to make said circuit design satisfy the expectation expressed in said second set of at least one correction probe and said third set of at least zero restriction probe, whereby the information on the location of the functional mistake is derived.

2. A computer-implemented method of claim 1, wherein said representation of the relationships among objects including said circuit design, said first set of at least one candidate branch, said second set of at least one correction probe, and said third set of at least zero restriction probe is a fourth set of at least one binary decision diagram.

3. A computer-implemented method of claim 2, wherein an input variable of a member of said fourth set of at least one binary decision diagram corresponds to a member of said first set of at least one candidate branch.

4. A computer-implemented method of claim 3, wherein said combinations of behaviors at members of said first set of at least one candidate branch to make said circuit design satisfy the expectation expressed in said second set of at least one correction probe and said third set of at least zero restriction probe are represented as paths that connect the root node to a predetermined leaf node in a member of said fourth set of at least one binary decision diagram.

5. A computer-implemented method of claim 4, wherein a member of said fourth set of at least one binary decision diagram is ordered and reduced.

6. A computer-implemented method of claim 5, wherein further comprising the step of:

computing, based on said combinations of behaviors at members of said first set of at feast one candidate branch, a rating for a member of said first set of at least one candidate branch.

7. A computer-implemented method of claim 6, wherein further comprising the step of:

determining, based on said rating for said member of said first set of at least one candidate branch, whether the behavior at said member of said first set of at least one candidate branch must be changed to make said circuit design satisfy the expectation expressed in said second set of at least one correction probe and said third set of at least zero restriction probe.

8. A computer-implemented method of claim 6, wherein further comprising the step of:

determining, based on said rating for said member of said first set of at least one candidate branch, whether the behavior at said member of said first set of at least one candidate branch can be changed, in association with changes of behaviors at other members of said first set of at least one candidate branch, to make said circuit design satisfy the expectation expressed in said second set of at least one correction probe and said third set of at least zero restriction probe.

9. A computer-implemented method of claim 6, wherein further comprising the step of:

determining, based on said rating for said member of said first set of at least one candidate branch, whether the behavior at said member of said first set of at least one candidate branch is never required to be changed to make said circuit design satisfy the expectation expressed in said second set of at least one correction probe and said third set of at least zero restriction probe.

10. A computer-implemented method of claim 5, wherein further comprising the step of:

determining, based on said combinations of behaviors at members of said first set of at least one candidate branch, whether the behavior at said member of said first set of at least one candidate branch has no impact on whether said circuit design satisfies the expectation expressed in said second set of at least one correction probe and said third set of at least zero restriction probe.

11. A computer-implemented method of claim 5, wherein further comprising the step of:

determining, based on said combinations of behaviors at members of said first set of at least one candidate branch, whether the behavior at said member of said first set of at least one candidate branch can be changed, in association with changes of behaviors at other members of said first set of at least one candidate branch, to make said circuit design satisfy the expectation expressed in said second set of at least one correction probe and said third set of at least zero restriction probe.

12. A computer-implemented method of claim 4, wherein further comprising the step of:

determining, based on said combinations of behaviors at members of said first set of at least one candidate branch, whether the behavior at said member of said first set of at least one candidate branch can be changed, in association with changes of behaviors at other members of said first set of at least one candidate branch, to make said circuit design satisfy the expectation expressed in said second set of at least one correction probe and said third set of at least zero restriction probe.

13. A computer-implemented method of claim 1, wherein further comprising the step of:

determining, based on said combinations of behaviors at members of said first set of at least one candidate branch, whether the behavior at said member of said first set of at least one candidate branch can be changed, in association with changes of behaviors at other members of said first set of at least one candidate branch, to make said circuit design satisfy the expectation expressed in said second set of at least one correction probe and said third set of at least zero restriction probe.

14. A computer-implemented method of claim 1, wherein further comprising the step of:

computing a rating for a member of said first set of at least one candidate branch based on said combinations of behaviors at members of said first set of at least one candidate branch.

15. A computer-implemented method of claim 14, wherein further comprising the step of:

determining, based on said rating for said member of said first set of at least one candidate branch, whether the behavior at said member of said first set of at least one candidate branch can be changed, in association with changes of behaviors at other members of said first set of at least one candidate branch, to make said circuit design satisfy the expectation expressed in said second set of at least one correction probe and said third set of at least zero restriction probe.

16. A computer-implemented method of claim 1, further comprising the step of:

constructing a fifth set of at least one branch cone wherein each input to a member of said fifth set of at least one branch cone corresponds to a member of said first set of at least one candidate branch, whereby said fifth set of at least one branch cone is used for the step of building said representation of the relationships among objects including said circuit design, said first set of at least one candidate branch, said second set of at least one correction probe, and said third set of at least zero restriction probe.

17. A computer-implemented method of claim 1, wherein said third set of at least zero restriction probe has one or more members.

18. A computer-implemented method of claim 1, wherein said circuit design, said first set of at least one candidate branch, said second set of at least one correction probe, and said third set of at least zero restriction probe are all stored in computers.

19. A computer-implemented method of claim 2, wherein said circuit design, said first set of at least one candidate branch, said second set of at least one correction probe, said third set of at least zero restriction probe, and said fourth set of at least one binary decision diagram are all stored in computers.

20. A computer-implemented method of claim 16, wherein said circuit design, said first set of at least one candidate branch, said second set of at least one correction probe, said third set of at least zero restriction probe, said fourth set of at least one binary decision diagram, and said fifth set of at least one branch cone are all stored in computers.

* * * * *